(12) United States Patent
Watanabe et al.

(10) Patent No.: US 11,754,762 B2
(45) Date of Patent: Sep. 12, 2023

(54) LIGHT-EMITTING DEVICE

(71) Applicant: Pioneer Corporation, Tokyo (JP)

(72) Inventors: Teruichi Watanabe, Yonezawa (JP); Hiroki Tan, Yonezawa (JP); Isamu Ohshita, Tokyo (JP)

(73) Assignee: Pioneer Corporation, Tokyo (JP)

( * ) Notice: Subject to any disclaimer, the term of this patent is extended or adjusted under 35 U.S.C. 154(b) by 263 days.

(21) Appl. No.: 17/153,813

(22) Filed: Jan. 20, 2021

(65) Prior Publication Data

US 2021/0165146 A1  Jun. 3, 2021

Related U.S. Application Data

(63) Continuation of application No. 16/077,365, filed as application No. PCT/JP2017/004916 on Feb. 10, 2017, now Pat. No. 10,928,567.

(30) Foreign Application Priority Data

Feb. 12, 2016 (JP) .................................. 2016-025293

(51) Int. Cl.
*G02B 5/22* (2006.01)
*H05B 33/22* (2006.01)
(Continued)

(52) U.S. Cl.
CPC ............... *G02B 5/22* (2013.01); *H05B 33/22* (2013.01); *H05B 33/26* (2013.01); *H10K 50/00* (2023.02);
(Continued)

(58) Field of Classification Search
CPC ..... H01L 51/50; H01L 51/5284; H01L 33/54; H01L 33/56; H05B 33/22; H05B 33/26; G02B 5/22
(Continued)

(56) References Cited

U.S. PATENT DOCUMENTS 8,319,419 B2   11/2012  Mitsufumi et al.
9,647,232 B2    5/2017  Kakizoe et al.
(Continued)

FOREIGN PATENT DOCUMENTS

JP   2006-054200 A   2/2006
JP   2011-023336 A   2/2011
(Continued)

OTHER PUBLICATIONS

International Search Report for related International Application No. PCT/JP2017/004916, dated Apr. 18, 2017; 2 pages.
(Continued)

*Primary Examiner* — Tuyen Tra
(74) *Attorney, Agent, or Firm* — Procopio, Cory, Hargreaves & Savitch LLP

(57) ABSTRACT

A plurality of light-emitting units (140) are provided on a first surface (100a) of a substrate (100) and are separated from each other. Each light-emitting unit (140) includes a light-transmitting first electrode (110), an organic layer (120), and a light-reflective second electrode (130). The organic layer (120) is located between the first electrode (110) and the second electrode (130). A light-transmitting region is located between the light-emitting units (140) and transmits light in the thickness direction of a light-emitting device (10). An optical filter (200) overlaps the light-transmitting region and does not overlap the plurality of light-emitting units (140).

12 Claims, 9 Drawing Sheets

(51) Int. Cl.
  *H10K 50/00* (2023.01)
  *H10K 50/86* (2023.01)
  *H05B 33/26* (2006.01)
  *H01L 33/54* (2010.01)
  *H01L 33/56* (2010.01)

(52) U.S. Cl.
  CPC ............ *H10K 50/865* (2023.02); *H01L 33/54* (2013.01); *H01L 33/56* (2013.01)

(58) Field of Classification Search
  USPC ....................................................... 359/885
  See application file for complete search history.

(56) References Cited

U.S. PATENT DOCUMENTS

| 9,680,124 | B2 | 6/2017 | Kato et al. |
| 10,928,567 | B2 * | 2/2021 | Watanabe ............... H01L 51/50 |
| 2010/0314616 | A1 | 12/2010 | Mitsufumi et al. |
| 2013/0009194 | A1 * | 1/2013 | Yamazaki ............. H01L 51/524 257/E33.059 |
| 2015/0340643 | A1 | 11/2015 | Kato et al. |
| 2015/0340650 | A1 | 11/2015 | Kakizoe et al. |

FOREIGN PATENT DOCUMENTS

| JP | 2011-228249 A | 11/2011 |
| JP | 2014154211 A | 8/2014 |
| JP | 2014167898 A | 9/2014 |
| KR | 10-2015-0015278 A | 2/2015 |
| KR | 10-2015-0054384 A | 5/2015 |
| WO | 2015079519 A1 | 6/2015 |

OTHER PUBLICATIONS

Office Action for related JP App. No. 2017567009 dated Dec. 24, 2019; 3 pages.

\* cited by examiner

LIGHT-EMITTING DEVICE

TECHNICAL FIELD

The present invention relates to a light-emitting device.

BACKGROUND ART

In recent years, there has been progress in the development of light-emitting devices using an organic EL. Such a light-emitting device is used as an illumination device or a display device and has a configuration in which an organic layer is interposed between a first electrode and a second electrode. Generally, a transparent material is used for the first electrode, and a metal material is used for the second electrode.

One of the light-emitting devices using an organic EL is a technology described in Patent Document 1. In the technique of Patent Document 1, the second electrode is provided only in a portion of a pixel in order to cause a display device using an organic EL to have optical transparency (see-through property). In such a structure, since a region located between a plurality of second electrodes transmits light, the display device can have optical transparency. Meanwhile, in the technique disclosed in Patent Document 1, a light-transmitting insulating film is formed between the plurality of second electrodes in order to define a pixel. In Patent Document 1, an example of a material of this insulating film includes an inorganic material such as a silicon oxide, or a resin material such as an acrylic resin.

RELATED DOCUMENT

Patent Document

[Patent Document 1] Japanese Unexamined Patent Publication No. 2011-23336

SUMMARY OF THE INVENTION

Technical Problem

Depending on the application of a light-transmitting light-emitting device, the amount and color of light transmitted through the light-emitting device may be desired to be restricted. Even in such a case, it is often the case that the amount and color of light which is radiated from a light-emitting unit of the light-emitting device is not desired to be restricted.

An exemplary problem to be solved by the present invention is to restrict the amount and color of light which is transmitted through a light-emitting device having optical transparency and to prevent the amount and color of light which is radiated from a light-emitting unit from being restricted.

Solution to Problem

According to the invention of claim 1, there is provided a light-emitting device including: a light-transmitting substrate; a plurality of light-emitting units, provided on a first surface of the substrate away from each other, each light-emitting unit including a light-transmitting first electrode, a light-reflective second electrode, and an organic layer located between the first electrode and the second electrode; a light-transmitting region which is located between the light-emitting units, and through which light is transmitted in a thickness direction; and an optical filter that overlaps the light-transmitting region, and does not overlap the plurality of light-emitting units or overlaps a surface of the plurality of light-emitting units on an opposite side to a light emission surface.

BRIEF DESCRIPTION OF THE DRAWINGS

The above and other objects, features and advantages will be made clearer from certain preferred embodiment described below, and the following accompanying drawings.

DESCRIPTION OF EMBODIMENTS

Figure 1:
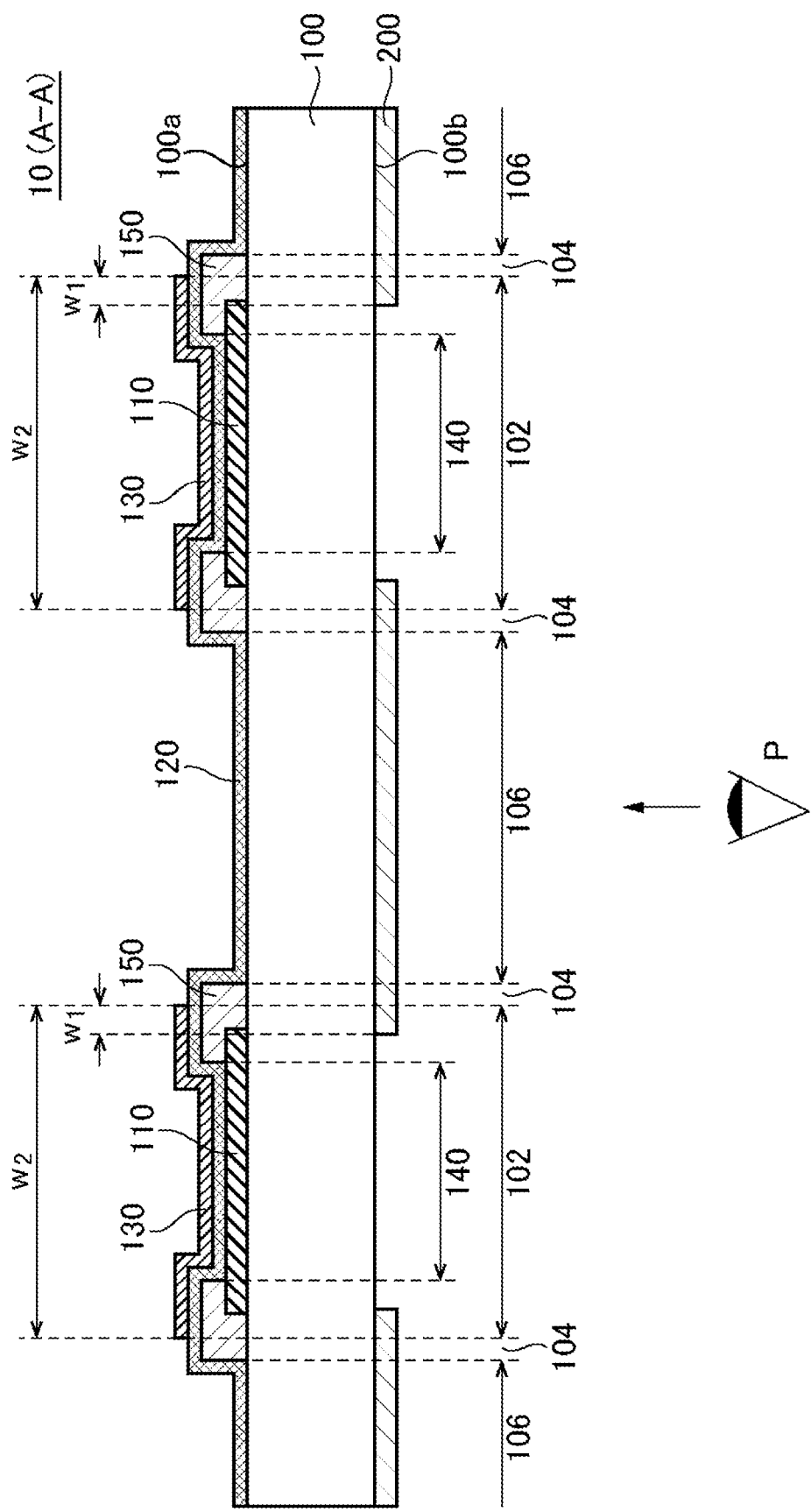
FIG. 1 is a cross-sectional view illustrating a configuration of a light-emitting device according to an embodiment.

Hereinafter, embodiments of the present invention will be described with reference to the accompanying drawings. In all the drawings, like elements are referenced by like reference numerals and the descriptions thereof will not be repeated.

Embodiment

Figure 2:
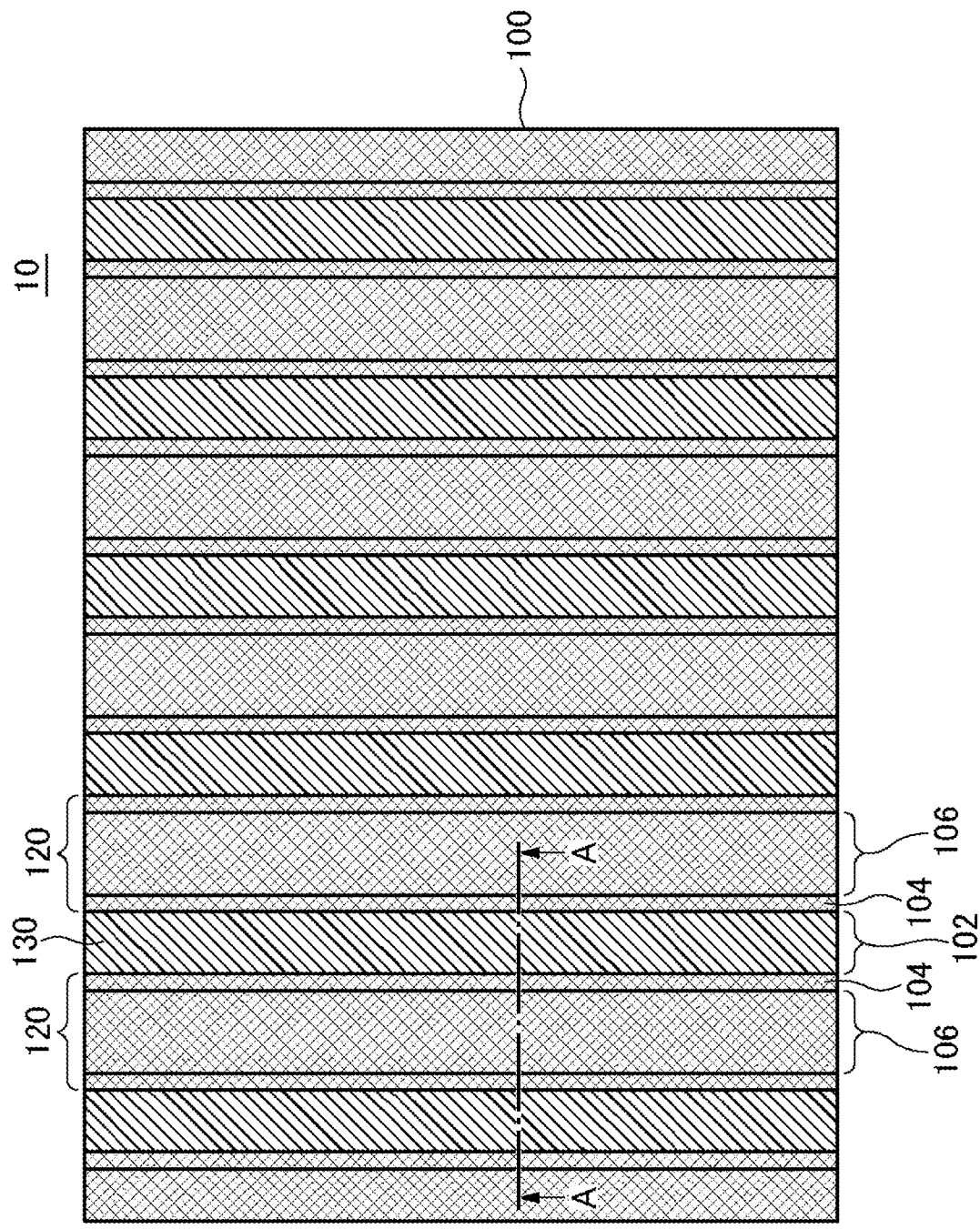
FIG. 2 is a plan view of the light-emitting device.

FIG. 1 is a cross-sectional view illustrating a configuration of a light-emitting device 10 according to an embodiment. FIG. 2 is a plan view of the light-emitting device 10. FIG. 1 corresponds to a cross-section A-A of FIG. 2. The light-emitting device 10 according to the embodiment includes a light-transmitting substrate 100, a plurality of light-emitting units 140, a light-transmitting region (second region 104 and third region 106), and an optical filter 200. The plurality of light-emitting units 140 are provided on a first surface 100a of the substrate 100 and are separated from each other. The light-emitting unit 140 includes a light-transmitting first electrode 110, an organic layer 120, and a light-reflective second electrode 130. The organic layer 120 is located between the first electrode 110 and the second electrode 130. The light-transmitting region is located between the light-emitting units 140 and transmits light in the thickness direction of the light-emitting device 10. The optical filter 200 overlaps the light-transmitting region and does not overlap the plurality of light-emitting units 140. Meanwhile, the optical filter 200 may overlap the end of the light-emitting unit 140. However, as shown in a modification example described later, the optical filter 200 may cover the surface of the light-emitting unit 140 on the opposite side to a light emission surface. In other words, the optical filter 200 is not located on the light emission side of the light-emitting unit 140. Hereinafter, a detailed description will be given.

The substrate 100 is, for example, a glass substrate or a resin substrate which has optical transparency. The substrate 100 may have flexibility. In a case where the substrate has flexibility, the thickness of the substrate 100 is, for example, equal to or greater than 10 µm and equal to or less than 1,000 µm. The substrate 100 is polygonal such as, for example, rectangular or circular. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, it is preferable that an inorganic barrier film of SiNx, SiON or the like is formed on at least one surface (preferably, both surfaces) of the substrate 100 in order to prevent moisture from permeating the substrate 100. Meanwhile, in a case where the substrate 100 is formed of a resin substrate, there are a method of directly forming the first electrode 110 and the organic layer 120, described later, on the resin substrate, a method of forming the first electrode 110 and subsequent layers on a glass substrate, then peeling off the first electrode 110 and the glass substrate, and further disposing a peeled-off laminate on the resin substrate, and the like.

The light-emitting unit 140 is formed on one surface of the substrate 100. The light-emitting unit 140 has a configuration in which the first electrode 110, the organic layer 120 including a light-emitting layer, and the second electrode 130 are laminated in this order. In a case where the light-emitting device 10 is an illumination device, the plurality of light-emitting units 140 extend linearly (for example, in straight lines). The plurality of light-emitting units 140 preferably extend in parallel with each other. On the other hand, in a case where the light-emitting device 10 is a display device, the plurality of light-emitting units 140 may be disposed to form a matrix or may be configured to form a segment or display a predetermined shape (to display, for example, an icon). The plurality of light-emitting units 140 are formed for each pixel.

The first electrode 110 is a transparent electrode having optical transparency. A material of the transparent electrode is a metal oxide formed of a material containing a metal, for example, an indium tin oxide (ITO), an indium zinc oxide (IZO), an indium tungsten zinc oxide (IWZO), a zinc oxide (ZnO) or the like. The thickness of the first electrode 110 is, for example, equal to or greater than 10 nm and equal to or less than 500 nm. The first electrode 110 is formed by, for example, sputtering or vapor deposition. Meanwhile, the first electrode 110 may be a conductive organic material such as a carbon nanotube or PEDOT/PSS. In addition, the first electrode 110 may have a laminated structure in which a plurality of films are laminated. In the drawing, a plurality of linear first electrodes 110 are formed on the substrate 100 in parallel with each other. Therefore, the first electrode 110 is not located in the second region 104 and the third region 106.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed by vapor deposition. In addition, at least one layer of the organic layer 120, for example, a layer which is in contact with the first electrode 110 may be formed using a coating method such as ink jetting, printing, or spraying. Meanwhile, in this case, the remaining layers of the organic layer 120 are formed by vapor deposition. In addition, all the layers of the organic layer 120 may be formed using a coating method. Meanwhile, another light-emitting layer (for example, inorganic light-emitting layer) may be included instead of the organic layer 120. In addition, the color of light emitted from the light-emitting layer (or the color of light which is radiated from the organic layer 120) may be different from or the same as the color of light emitted from a light-emitting layer of an adjacent light-emitting unit 140 (or the color of light which is radiated from the organic layer 120).

The second electrode 130 includes a metal layer constituted of a metal selected from a first group consisting of, for example, Al, Au, Ag, Pt, Mg, Sn, Zn, and In, or an alloy of metals selected from this first group. Therefore, the second electrode 130 has light shielding characteristics or light reflectivity. The thickness of the second electrode 130 is, for example, equal to or greater than 10 nm and equal to or less than 500 nm. The second electrode 130 is formed by, for example, sputtering or vapor deposition. In the example shown in the drawing, the light-emitting device 10 includes a plurality of linear second electrodes 130. The second electrode 130 is provided for each first electrode 110 and is larger in width than the first electrode 110. For this reason, the entirety of the first electrode 110 is overlapped and covered with the second electrode 130 in the width direction when seen from the direction perpendicular to the substrate 100. With such a configuration, the extraction direction of light emitted from the light-emitting layer of the organic layer 120 can be adjusted. Specifically, the radiation of light to the first surface 100a side of the light-emitting device 10 can be suppressed. Alternatively, the first electrode 110 may be larger in width than the second electrode 130, and the entirety of the second electrode 130 may be covered with the first electrode 110 in the width direction when seen from a direction perpendicular to the substrate 100. In this case, the amount of light emitted in the direction of the side of the light-emitting device 10 having the second electrode 130 formed thereon is relatively large.

The edge of the first electrode 110 is covered with an insulating film 150. The insulating film 150 is formed by adding a photosensitive material in a resin material such as, for example, polyimide, and surrounds a portion of the first electrode 110 which serves as the light-emitting unit 140. In other words, the insulating film 150 defines the light-emitting unit 140. The insulating film 150 has optical transparency. However, the light transmittance is not required to be high. In a case where the optical transparency of the insulating film 150 is high, the transmittance of the second region 104 described later becomes higher, and the transmittance of the light-emitting device 10 increases. On the other hand, by reducing the transmittance of the insulating film 150, it is possible to absorb light emitted in the light-emitting unit 140 which is diffused to the insulating film 150 side. Therefore, the light emitted from the light-emitting unit 140 can be emitted without being diffused when seen from the extraction surface. The edge of the second electrode 130 in its width direction is located over the insulating film 150. In other words, when seen from a direction perpendicular to a direction in which the light-emitting unit 140 extends, a portion of the insulating film 150 protrudes from the second electrode 130. In addition, in the example shown in the drawing, the organic layer 120 is also formed on the upper portion and lateral side of the insulating film 150.

When seen from the direction perpendicular to a direction in which the light-emitting unit 140 extends (that is, FIG. 2), the light-emitting device 10 includes a first region 102, the second region 104, and the third region 106.

The first region 102 is a region overlapping the second electrode 130. That is, when seen from the direction perpendicular to the substrate 100, the first region 102 is covered with the second electrode 130 and has a width the same as or different from that of the light-emitting unit 140. In the example shown in the drawing, the width of the first region 102 is larger than that of the light-emitting unit 140. The first region 102 is a region through which light is not transmitted from the front surface to the rear surface and from the rear surface to the front surface of the light-emitting device 10 or the substrate 100.

A region located between the second electrodes 130 serves as a region (light-transmitting region) through which visible light is transmitted. This light-transmitting region is constituted by the second region 104 (first light-transmitting region) and the third region 106 (second light-transmitting region). The second region 104 is a region of the light-transmitting regions which includes the insulating film 150. The third region 106 is a region of the light-transmitting regions which does not include the insulating film 150. The light transmittance of the third region 106 is higher than the light transmittance of the second region 104.

The width of the second region 104 is smaller than the width of the third region 106. Therefore, the light-emitting device 10 has sufficient optical transparency. In addition, the width of the third region 106 may be larger or smaller than the width of the first region 102. In a case where the width of the first region 102 is set to 1, the width of the second region 104 is, for example, equal to or greater than 0 (or greater than 0 or equal to or greater than 0.1) and equal to or less than 0.2, and the width of the third region 106 is, for example, equal to or greater than 0.3 and equal to or less than 2. In addition, the width of the first region 102 is, for example, equal to or greater than 50 μm and equal to or less than 500 μm, the width of the second region 104 is, for example, equal to or greater than 0 μm (or greater than 0 μm) and equal to or less than 100 μm, and the width of the third region 106 is, for example, equal to or greater than 15 μm and equal to or less than 1,000 μm.

Meanwhile, in the example shown in FIG. 1, at least a portion of the layers of the organic layer 120 is continuously formed in the first region 102, the second region 104, and the third region 106. In other words, the organic layer 120 of the plurality of light-emitting units 140 is continuously formed. With such a configuration, it is not necessary to use a mask when a continuous layer of the organic layer 120 is formed, and thus the manufacturing cost of the organic layer 120 can be reduced. However, the organic layer 120 is not required be formed in the third region 106. In addition, the organic layer 120 is not required be formed in the second region 104. In this case, the transmittance of the second region 104 and the third region 106 becomes higher, and the transmittance of the light-emitting device 10 also becomes higher.

In addition, the light-emitting units 140 may be lattice-shaped. In this case, the third region 106 becomes a region of the substrate 100 which is surrounded by the second electrodes 130.

The light-emitting device 10 further includes the optical filter 200. The optical filter 200 overlaps at least a portion of the light-transmitting region of the light-emitting device 10, preferably, the entirety thereof. The optical filter 200 is, for example, a light-shielding filter, and is a filter that shields a portion of visible light which is transmitted through the light-transmitting region. In a region of the light-transmitting region of the light-emitting device 10 which overlaps the optical filter 200, the transmittance of the visible light is, for example, equal to or greater than 10% and equal to or less than 80%. In this manner, the light-transmitting region of the light-emitting device 10 has the same function as that of light-shielding glass such as smoked glass. The optical filter 200 is, for example, a light-transmitting layer or a sheet which is lightly colored in black.

However, the optical filter 200 may be a color filter. In this case, the optical filter 200 transmits less light having a desired wavelength region than light having other wavelength regions.

In the example shown in FIG. 1, the optical filter 200 is provided on a surface (second surface 100b) of the substrate 100 on the opposite side to the light-emitting unit 140. The optical filter 200 covers the entirety of the third region 106, the entirety of the second region 104, and a portion of the first region 102. In other words, the edge of the optical filter 200 overlaps a portion of the first region 102 except the light-emitting unit 140, specifically, a region of the second electrode 130 which is located outside the light-emitting unit 140. The width of a region in which the optical filter 200 and the second electrode 130 overlap each other, in other words, a distance $w_1$ between the edge of the optical filter 200 and the edge of the second electrode 130 is, for example, equal to or greater than 0 μm and equal to or less than 1,000 μm. With such a configuration, even in a case where variation occurs in the position of the optical filter 200 with respect to the light-transmitting region (third region 106 and second region 104), or the width of the optical filter 200, it is possible to prevent a portion of the light-transmitting region which is not covered with the optical filter 200 from occurring.

Next, a method of manufacturing the light-emitting device 10 will be described. First, the first electrode 110 is formed on the substrate 100 by, for example, sputtering. Next, the first electrode 110 is formed in a predetermined pattern by, for example, photolithography. Next, the insulating film 150 is formed on the edge of the first electrode 110. For example, in a case where the insulating film 150 is formed of a photosensitive resin, the insulating film 150 is formed in a predetermined pattern by undergoing exposure and development steps. Next, the organic layer 120 and the second electrode 130 are formed in this order. In a case where the organic layer 120 includes a layer which is formed by vapor deposition, this layer is formed in a predetermined pattern using, for example, a mask or the like. The second electrode 130 is also formed in a predetermined pattern using, for example, a mask or the like. Thereafter, the light-emitting unit 140 is sealed using a sealing member (not shown).

The optical filter 200 is provided on the second surface 100b of the substrate 100. The optical filter 200 is formed by, for example, coating (for example, screen printing). At this time, a position at which the optical filter 200 is formed is determined on the basis of, for example, the positions of the insulating film 150 and the second electrode 130. Meanwhile, the optical filter 200 may be formed in advance in a sheet shape. In this case, the optical filter 200 is attached to the second surface 100b of the substrate 100 using, for example, an adhesive layer (or pressure-sensitive adhesive layer).

Hereinbefore, according to the present embodiment, the optical filter 200 covers the light-transmitting region of the light-emitting device 10 but does not cover the light-emitting unit 140. Therefore, it is possible to restrict the amount and color of light which is transmitted through the light-emitting device 10. In addition, the amount and color of light which is radiated from the light-emitting device 10 are not restricted.

MODIFICATION EXAMPLE 1

Figure 3:
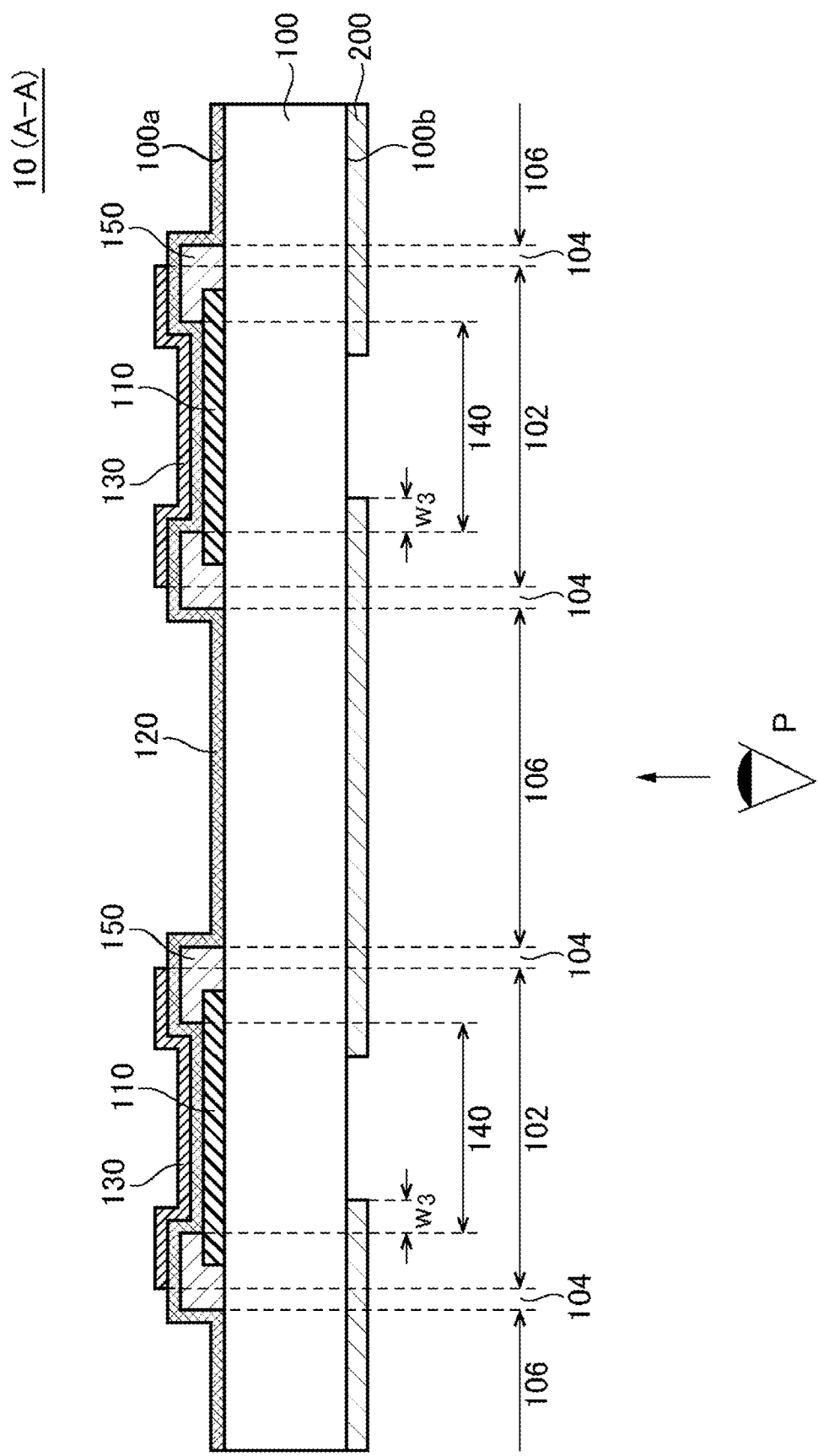
FIG. 3 is a cross-sectional view illustrating a configuration of a light-emitting device according to Modification Example 1.

FIG. 3 is a cross-sectional view illustrating a configuration of a light-emitting device 10 according to Modification Example 1 and corresponds to FIG. 1 of the embodiment. The light-emitting device 10 according to the present modification example has the same configuration as that of the light-emitting device 10 according to the embodiment, except that the edge of the optical filter 200 overlaps a region of the light-emitting unit 140 which is close to the insulating film 150. The width $w_3$ of a portion of the light-emitting unit 140 which is covered with the optical filter 200 is preferably equal to or less than 10% of the width of the light-emitting unit 140.

In the present modification example, the optical filter 200 covers the light-transmitting region of the light-emitting device 10, and thus it is also possible to restrict the amount and color of light which is transmitted through the light-emitting device 10. In addition, since the optical filter 200 covers only a fraction of the light-emitting unit 140, the amount and color of light which is radiated from the light-emitting device 10 is not substantially restricted.

MODIFICATION EXAMPLE 2

Figure 4:
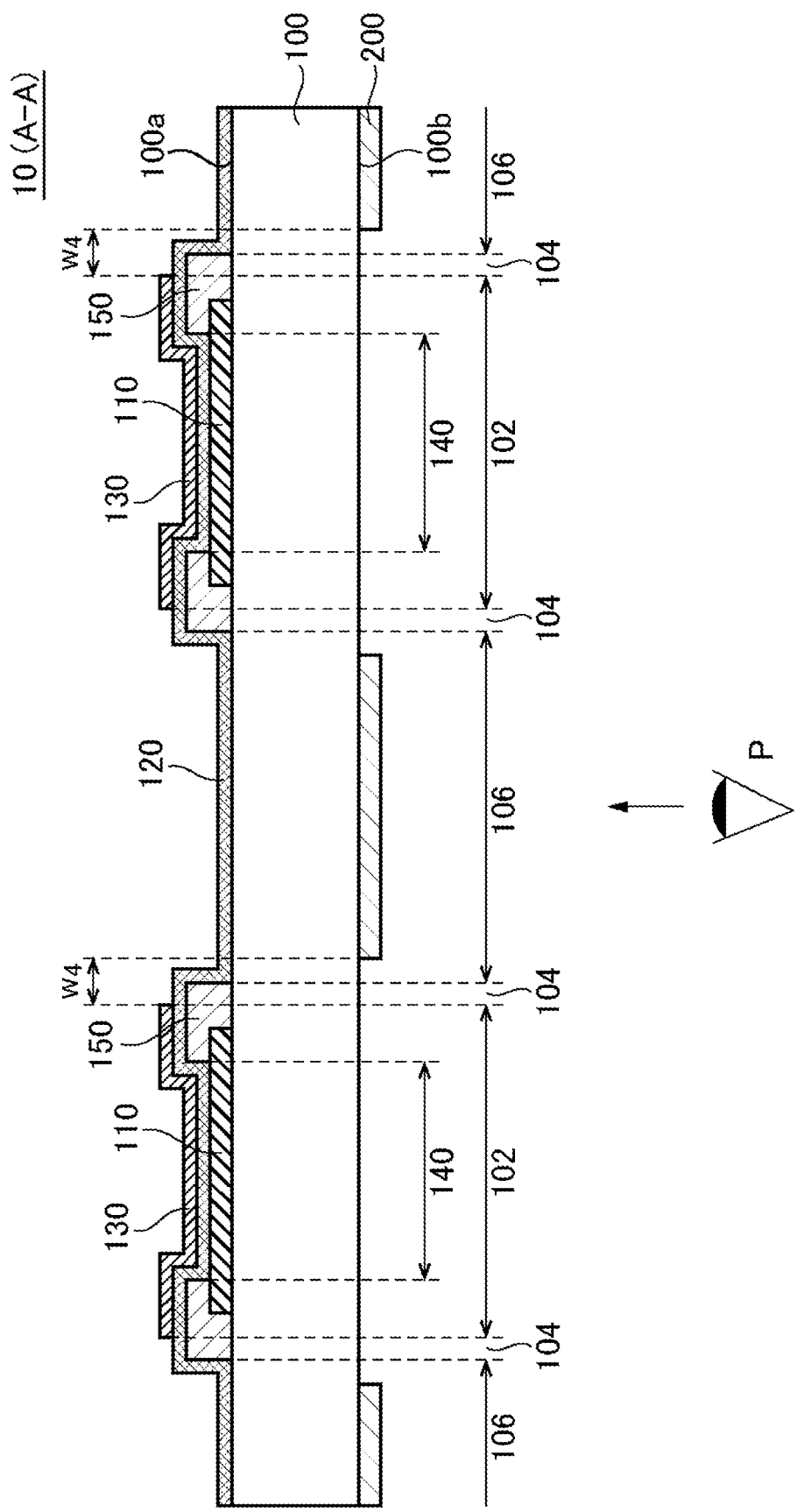
FIG. 4 is a cross-sectional view illustrating a configuration of a light-emitting device according to Modification Example 2.

FIG. 4 is a cross-sectional view illustrating a configuration of a light-emitting device 10 according to Modification Example 2 and corresponds to FIG. 1 of the embodiment. The light-emitting device 10 according to the present modification example has the same configuration as that of the light-emitting device 10 according to the embodiment, except that the edge of the optical filter 200 overlaps a region of the third region 106 (second light-transmitting region) which is close to the insulating film 150.

In other words, the optical filter 200 covers a portion of the third region 106 which excludes the edge but does not cover the edge of the third region 106, the second region 104, and the first region 102 (including the light-emitting unit 140). However, a distance between the edge of the second region 104 and the edge of the optical filter 200, in other words, a distance $w_4$ between the edge of the second electrode 130 and the edge of the optical filter 200 is preferably equal to or less than 10% of the length obtained by adding the second region 104 to the third region 106.

In the present modification example, the optical filter 200 covers a large portion of the third region 106, and thus it is also possible to restrict the amount and color of light which is transmitted through the light-emitting device 10. In addition, since the optical filter 200 does not cover the light-emitting unit 140, the amount and color of light which is radiated from the light-emitting device 10 are not restricted.

Meanwhile, the edge of the optical filter 200 may overlap the second region 104 (first light-transmitting region).

MODIFICATION EXAMPLE 3

Figure 5:
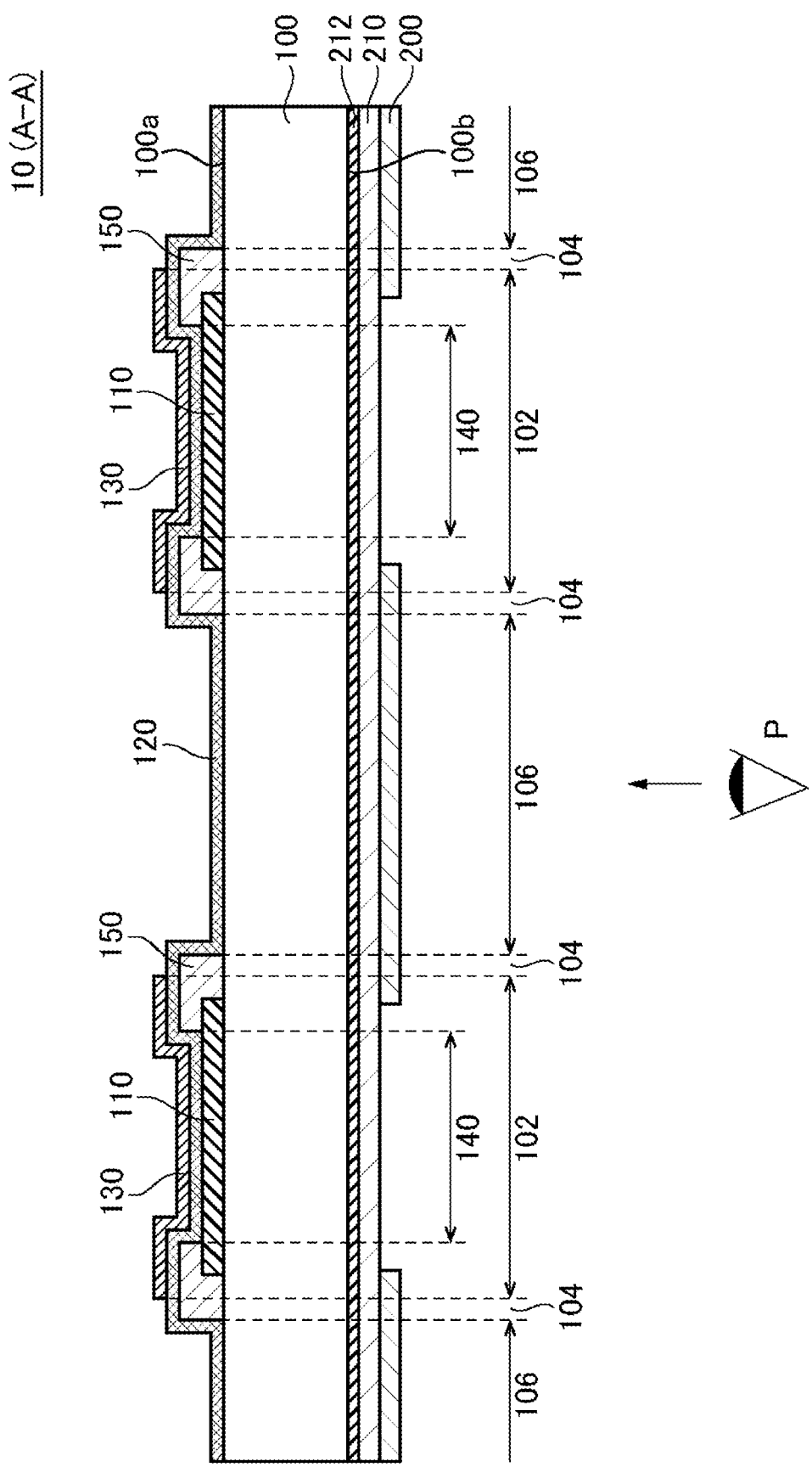
FIG. 5 is a cross-sectional view illustrating a configuration of a light-emitting device according to Modification Example 3.

FIG. 5 is a cross-sectional view illustrating a configuration of a light-emitting device 10 according to Modification Example 3 and corresponds to FIG. 1 of the embodiment. The light-emitting device 10 according to the present modification example has the same configuration as that of the light-emitting device 10 according to the embodiment, except that a sheet member 210 is included therein.

The sheet member 210 is, for example, a transparent resin, and is installed onto the second surface 100b of the substrate 100 using an adhesive layer 212 (or pressure-sensitive adhesive layer). The optical filter 200 is formed at least in a region of the sheet member 210 which faces the third region 106. However, the optical filter 200 is not formed in a region of the sheet member 210 which overlaps the light-emitting unit 140.

Meanwhile, in the drawing, a relative position between the optical filter 200 and the first region 102, the second region 104, and the third region 106 is as shown in the embodiment. However, this relative position may be the same as that in FIG. 2, may be the same as that in FIG. 3, and may be the same as that in FIG. 4.

In addition, in the example shown in the drawing, the optical filter 200 is provided on a surface of the sheet member 210 on the opposite side to the substrate 100. However, the optical filter 200 may be provided on a surface of the sheet member 210 which faces the substrate 100. In addition, the optical filter 200 may be formed by coloring a portion of the sheet member 210.

In the present modification example, as is the case with the embodiment, it is also possible to restrict the amount and color of light which is transmitted through the light-emitting device 10. In addition, the amount and color of light which is radiated from the light-emitting device 10 are not restricted. Further, the optical filter 200 can be installed onto the substrate 100 by attaching the sheet member 210 onto the substrate 100, and thus the optical filter 200 can be easily installed onto the substrate 100.

In addition, in a case where the refractive index of the sheet member 210 is between the refractive index of air and the refractive index of the substrate 100, it is possible to improve the light extraction efficiency of the light-emitting device 10.

MODIFICATION EXAMPLE 4

Figure 6:
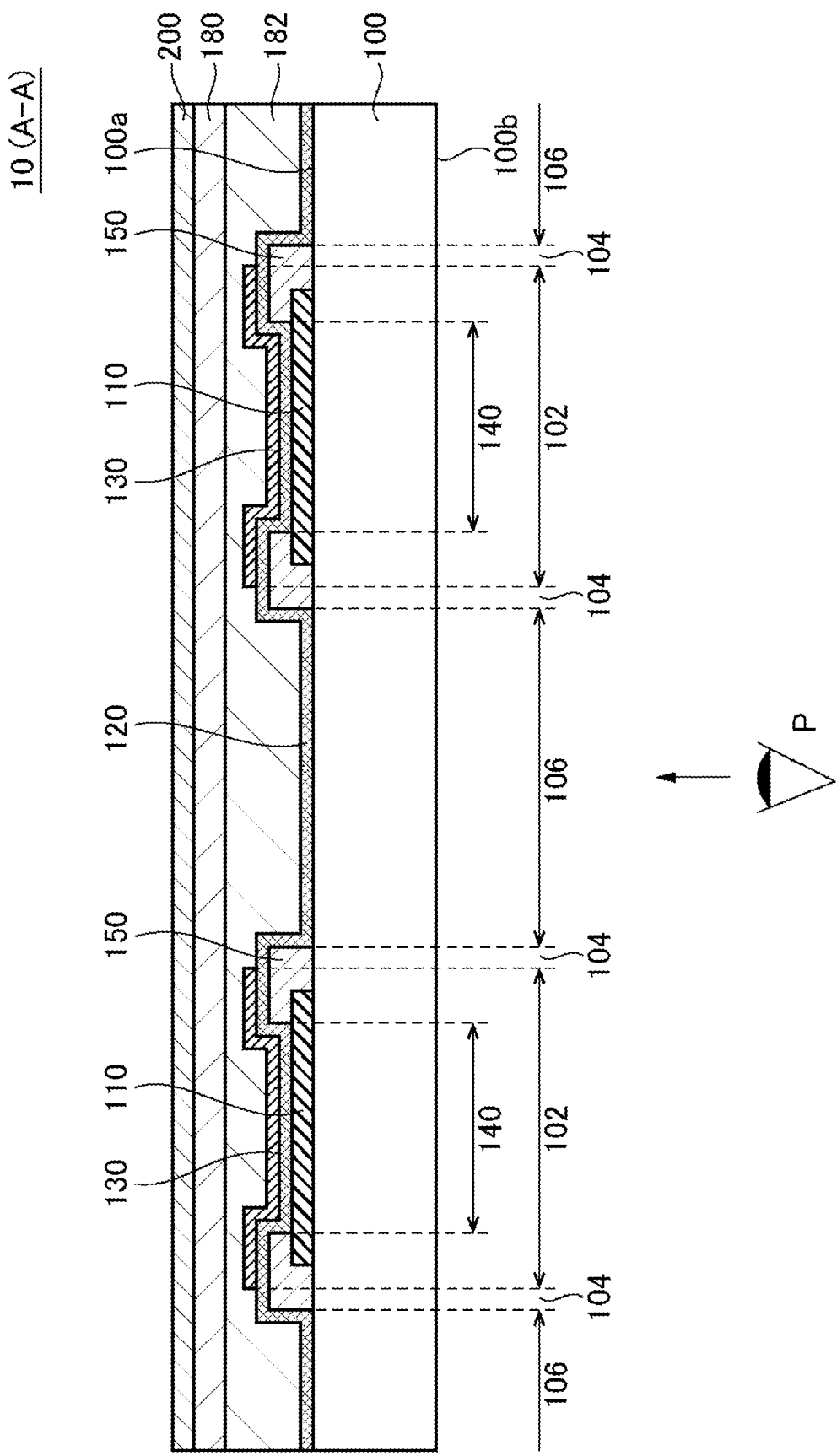
FIG. 6 is a cross-sectional view illustrating a configuration of a light-emitting device according to Modification Example 4.

FIG. 6 is a cross-sectional view illustrating a configuration of a light-emitting device 10 according to Modification Example 4. The light-emitting device 10 according to the present modification example has the same configuration as that of the light-emitting device 10 according to Modification Example 3, except that the optical filter 200 is provided on the first surface 100a side of the substrate 100.

Specifically, the light-emitting device 10 includes a sealing member 180. The sealing member 180 seals the light-emitting unit 140. In the example shown in the drawing, the sealing member 180 is a sheet-shaped member (for example, a resin sheet coated with an inorganic material on both sides thereof) and is installed on the substrate 100 and the light-emitting unit 140 with an insulating layer 182 (adhesive layer) interposed therebetween. The optical filter 200 is provided on a surface of the sealing member 180 on the opposite side to the substrate 100. Meanwhile, the sealing member 180 may have another structure (for example, so-called can encapsulation structure).

The optical filter 200 covers all of the first region 102, the second region 104, and the third region 106. In other words, the optical filter 200 does not have an opening at a position overlapping the light-emitting unit 140.

Meanwhile, as is the case with Modification Example 3, the optical filter 200 may be provided on the sheet member 210. In this case, the sheet member 210 is attached to the sealing member 180 using the adhesive layer 212 shown in FIG. 5. The optical filter 200 may be provided on a surface of the sheet member 210 which faces the sealing member 180, may be provided on a surface of the sheet member 210 on the opposite side to the sealing member 180, and may be provided inside the sheet member 210.

In the present modification example, as is the case with the embodiment, it is also possible to restrict the amount and color of light which is transmitted through the light-emitting device 10. In addition, since the optical filter 200 is provided on a surface of the light-emitting device 10 on the opposite side to a light emission surface, the amount and color of light which is radiated from the light-emitting device 10 are not restricted. In addition, since a pattern is not required to be provided in the optical filter 200, a relative position between the light-emitting unit 140 and the optical filter 200 is not required to be aligned when the optical filter 200 is installed on the substrate 100. Therefore, the yield rate of the light-emitting device 10 is improved.

Meanwhile, in a case where the sealing member 180 has optical transparency, a function of the optical filter 200 may be given to the sealing member 180 by coloring the sealing member 180. In this case, since the sealing member 180 also serves as the optical filter 200, the cost of the light-emitting device 10 is reduced.

MODIFICATION EXAMPLE 5

Figure 7:
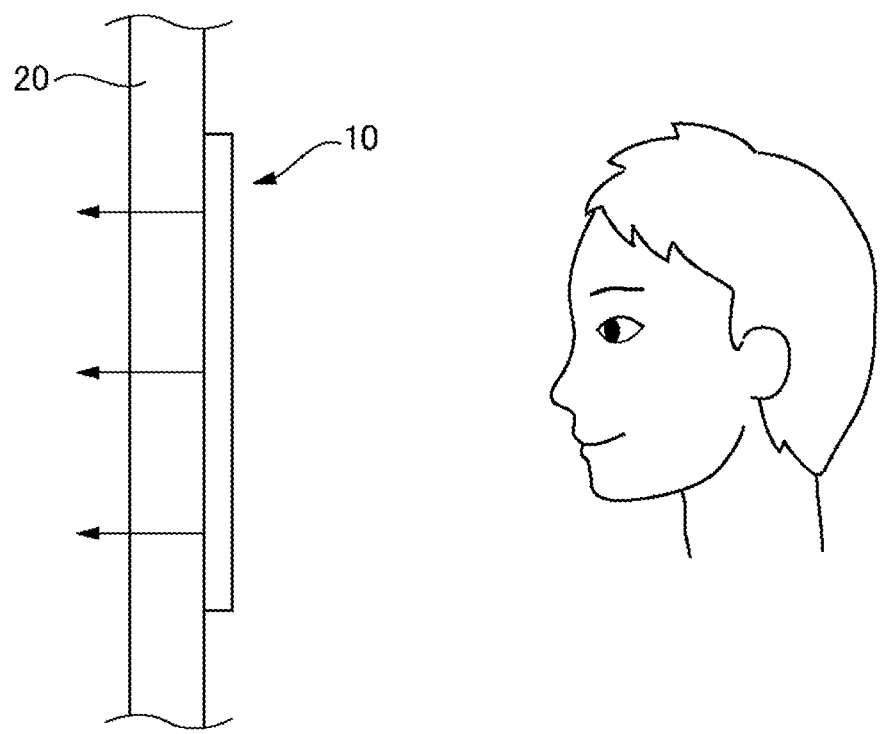
FIG. 7 is a cross-sectional view of a light-emitting device according to Modification Example 5.
Figure 8:
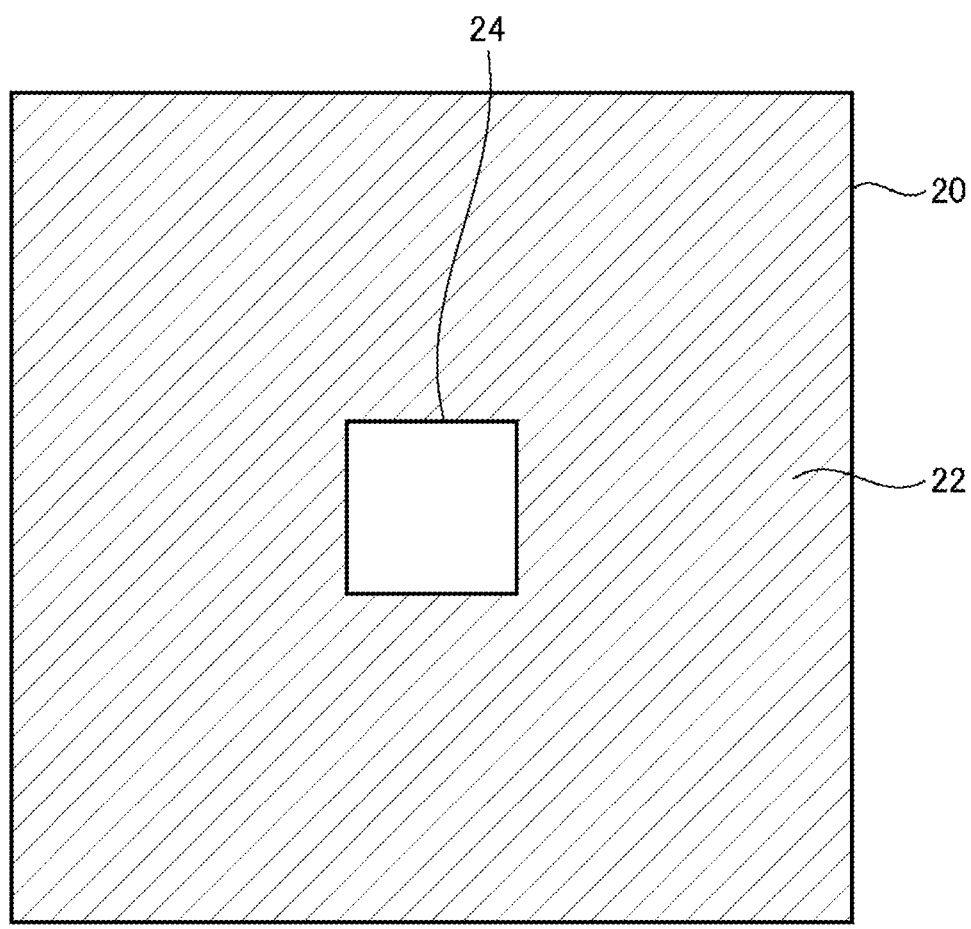
FIG. 8 is a plan view of a light-transmitting member shown in FIG. 7.

FIG. 7 is a cross-sectional view of a light-emitting system including a light-emitting device 10 according to Modification Example 5 and a light-transmitting member 20. FIG. 8 is a plan view of the light-transmitting member 20 shown in FIG. 7. In the present example, the substrate 100 is installed on one surface of the light-transmitting member 20 (holding member). The light-transmitting member 20 is, for example, window glass. In a case where the light-transmitting member 20 is window glass of a building or a moving object (for example, an automobile, a train, or an airplane), the light emission surface (second surface 100b) of the substrate 100 faces, for example, the light-transmitting member 20. That is, light emitted by the light-emitting unit 140 is radiated to the outside of a building or a moving object through the light-transmitting member 20. Meanwhile, in a case where the light-emitting unit 140 is provided on the outer surface of a building or a moving object, the light emission surface of the substrate 100 faces an opposite side to the light-transmitting member 20.

The light-transmitting member 20 is provided with a pattern 22 for giving light shielding characteristics. The pattern 22 is formed by, for example, bonding a light shielding layer, mixing a material to lower transmittance with a material of the light-transmitting member 20, mixing a material of light shielding characteristics with glass in a case where the light-transmitting member has a structure in which glass and glass are coupled, or forming a light-shielding material in an intermediate layer located between glass and glass. However, the pattern 22 is not provided in a region (substrate holding region 24) of the light-transmitting member 20 which overlaps the substrate 100.

In the present example, a portion of the light-emitting device 10 except the light-transmitting member 20 has a configuration shown in the embodiment and any of Modification Examples 1 to 4. As a first example, the optical filter 200 is located between the substrate 100 and the light-transmitting member 20, and in a region which does not overlap the plurality of light-emitting units 140. In this case, the optical filter 200 does not overlap at least a large portion (preferably the entirety) of the light-emitting unit 140. In addition, as a second example, the optical filter 200 overlaps a surface of the plurality of light-emitting units 140 on the opposite side to the light emission surface. In this case, the optical filter 200 may overlap the light-emitting unit 140.

Since the optical filter 200 is provided, it is possible to restrict the amount and color of light which is transmitted through the light-emitting device 10. On the other hand, the amount and color of light which is radiated from the light-emitting device 10 are not restricted by the optical filter 200. In addition, it is possible to reduce a difference between the transmittance of the light-transmitting member 20 and the transmittance of the light-emitting device 10. In other words, in a case where the light-emitting system is viewed, it is possible to reduce a difference in appearance between a portion provided with the light-emitting device 10 and the other portions. In addition, it is possible to reduce the manufacturing costs of the light-emitting device 10 and the light-emitting system by mass-producing portions other than the optical filter 200 of the light-emitting device 10 and selecting the optical filter 200 having a transmittance not different from the transmittance of the light-transmitting member 20.

Here, the transmittance of the optical filter 200 is preferably higher than the transmittance of a region of the light-transmitting member 20 which is provided with the pattern 22. The reason is as follows.

Since the first region 102 of the light-emitting device 10 is a region in which the light-reflective second electrode 130 is formed, the light transmittance of the first region 102 is substantially 0%. Here, the area (substantially equal to the area of the substrate holding region 24) of the light-emitting device 10 installed in the substrate holding region 24 of the light-transmitting member 20 is set to S, and the area of the first region 102 is set to A. As described above, since the width of the second electrode 130 is small, the second electrode 130 is hardly visibly recognizable to the human eye. However, since the area of a region of the substrate holding region 24 through which light is transmitted is "S-A", the amount of light which is transmitted through the substrate holding region 24 becomes smaller. Therefore, the substrate holding region 24 becomes darker overall than in a case where the second electrode 130 is not present. Therefore, in a case where the transmittance of the optical filter 200 is the same as the transmittance of the pattern 22 of the light-transmitting member 20, the apparent transmittance of visible light of the light-emitting device 10 (that is, substrate holding region 24) becomes lower by A/S than the transmittance (hereinafter, referred to as B) of a region of the light-transmitting member 20 which has the pattern 22. Consequently, by adjusting the transmittance of the optical filter 200 in a direction of becoming higher than B by B×A/S, it is possible to make it hard to feel a difference between the apparent transmittance of the light-emitting device 10 and the substrate holding region 24 and that of the pattern 22.

In a case where visible light is transmitted through the substrate holding region 24 of the light-transmitting member 20 and the light-emitting device 10 by performing the above adjustment, the light transmittance thereof is equal to or greater than 80% and equal to or less than 120% of the transmittance of visible light of a region of the light-transmitting member 20 which is provided with the pattern 22, preferably equal to or greater than 90% and equal to or less than 110%, more preferably equal to or greater than 95% and equal to or less than 105%, and further more preferably equal to or greater than 99% and equal to or less than 101%.

Meanwhile, the transmittance of light of a region in which the substrate holding region 24 and the light-emitting device 10 overlap each other is defined and measured, for example, as follows. In the substrate holding region 24 of the light-transmitting member 20, the area of a region overlapping the first region 102 is set to S1, the area of a region overlapping the second region 104 is set to S2, and the area of a region overlapping the third region 106 is set to S3. In addition, in the substrate holding region 24, the transmittance of light of a region overlapping the first region 102 is set to X, the transmittance of light of a region overlapping the second region 104 is set to Y, and the transmittance of light of a region overlapping the third region 106 is set to Z. Then, the transmittance of light which is transmitted through the substrate holding region 24 and the light-emitting device 10 is regarded as $$(S1 \times X + S2 \times Y + S3 \times Z)/(X+Y+Z) \times 100 (\%).$$

In addition, the transmittance of light of a region in which the substrate holding region 24 and the light-emitting device 10 overlap each other may be measured using a method of measuring total light transmittance specified in JIS K 7375: 2008. Further, in a case where the intensity of light incident on the entire surface of the light-emitting device 10 from the first surface 100a side of the substrate 100 is set to P, and the intensity of light emitted from the second surface 100b side of the substrate 100 is set to T, the transmittance of light of a region in which the substrate holding region 24 and the light-emitting device 10 overlap each other may be set to T/P×100%.

However, a method of measuring the transmittance of light of a region in which the substrate holding region 24 and the light-emitting device 10 overlap each other is not limited to these examples.

Meanwhile, the transmittance of visible light transmitted through the substrate holding region 24 of the light-transmitting member 20, the optical filter 200, and the light-emitting device 10 may be equal to or greater than 80% and equal to or less than 120% of the transmittance of visible light of the pattern 22 (peripheral region) of the light-transmitting member 20.

With such a configuration, when the light-emitting device 10 does not emit light, a person viewing the light-transmitting member 20 is not likely to recognize a boundary between a region which is provided with the light-emitting device 10 and a region in the periphery thereof. In other words, a person viewing the light-transmitting member 20 is not likely to notice that the light-emitting device 10 is present. Meanwhile, the transmittance of visible light of a region of the light-transmitting member 20 which is not provided with the light-emitting device 10 can also be regarded as the transmittance of visible light in a region in which the light-transmitting member 20 and the pattern 22 overlap each other.

Here, in the area S (substantially the area of the substrate holding region 24) of the light-emitting device 10 installed in the substrate holding region 24 of the light-transmitting member 20, the first region 102 of the light-emitting device is a region in which the light-reflective second electrode 130 is formed, and its light transmittance is substantially 0%. Here, in a case where an area occupied by the first region 102 in S is set to A, and the transmittance of the optical filter 200 is the same as the transmittance of the pattern 22 of the light-transmitting member 20, the apparent transmittance in the light-emitting device 10 and the substrate holding region 24 becomes lower by A/S than the transmittance (hereinafter, referred to as B) of the pattern 22 portion. Consequently, the transmittance of the optical filter 200 is adjusted by B×A/S, and thus it is possible to make it hard to feel a difference in apparent transmittance between the light-emitting device 10 and the substrate holding region 24 and the pattern 22.

MODIFICATION EXAMPLE 6

Figure 9:
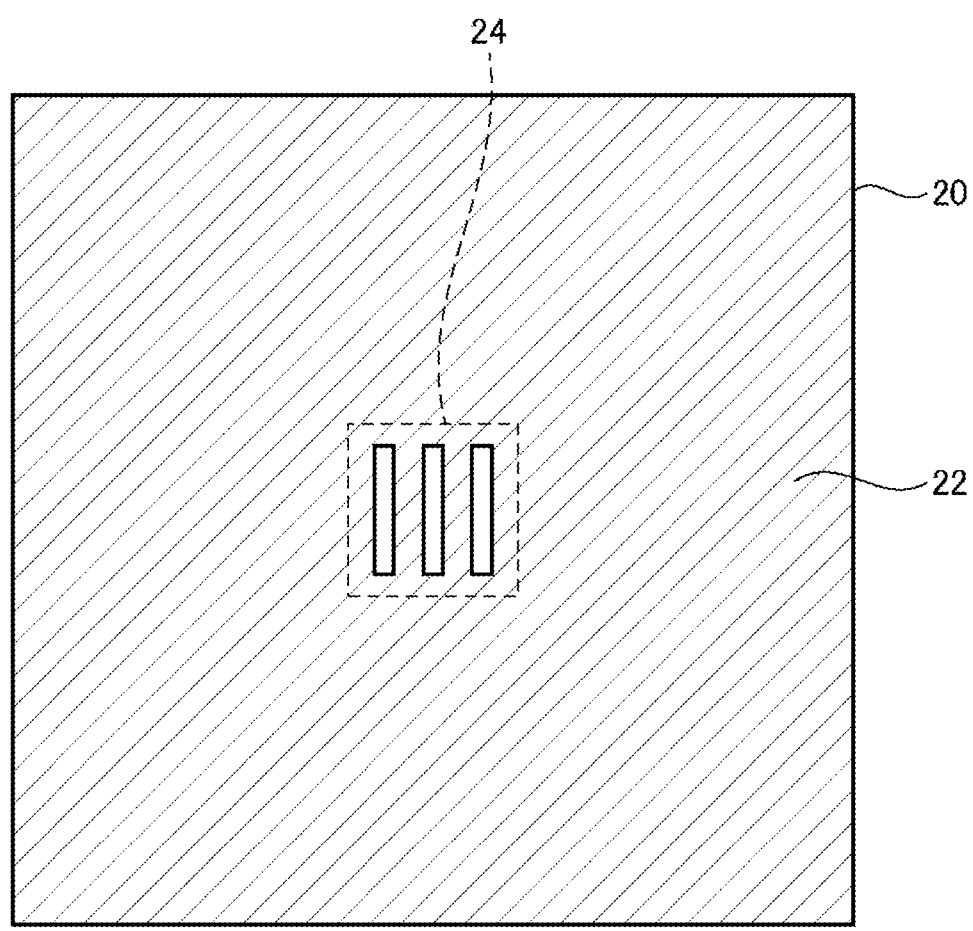
FIG. 9 is a plan view of a light-transmitting member according to Modification Example 6.

FIG. 9 is a plan view of a light-transmitting member 20 according to Modification Example 6. The present modification example has the same configuration as that of the light-emitting device 10 according to Modification Example 5, except for the following points.

In the present modification example, the light-emitting device 10 does not include the optical filter 200. Instead thereof, the pattern 22 is also formed in the substrate holding region 24 of the light-transmitting member 20, except for a region overlapping the light-emitting unit 140. In other words, the pattern 22 is provided in at least a portion of the light-transmitting member 20 which overlaps the third region 106 but is not provided in a region of the light-transmitting member 20 which overlaps the light-emitting unit 140. A region of the pattern 22 which overlaps the substrate 100 functions as an optical filter.

Meanwhile, a relative position between the pattern 22 in the substrate holding region 24 and the insulating film 150, and the second electrode 130 is the same as the relative position between the optical filter 200 in the embodiment or any of Modification Examples 1 to 4 and the insulating film 150, and the second electrode 130. In addition, the light transmittance of a portion of the pattern 22 which is located in the substrate holding region 24 may be higher than the light transmittance of other portions of the pattern 22. By appropriately setting a difference between these light transmittances, a difference between the light transmittance of visible light of a region of the light-transmitting member 20 which is not provided with the substrate 100 and the light transmittance of visible light of a region in which the light-transmitting member 20 and the substrate 100 overlap each other can be made smaller (for example, equal to or less than 10%, preferably equal to or less than 5%, more preferably equal to or less than 1%).

According to the present modification example, it is possible to restrict the amount and color of light which is transmitted through the light-emitting device 10. In addition, the amount and color of light which are radiated from the light-emitting device 10 are not restricted. In addition, the optical filter 200 is not required to be installed on the substrate 100.

As described above, although the embodiments and examples of the present invention have been set forthwith reference to the accompanying drawings, they are merely illustrative of the present invention, and various configurations other than those stated above can be adopted.

This application claims priority from Japanese Patent Application No. 2016-025293 filed on Feb. 12, 2016, the content of which is incorporated herein by reference in its entirety.

The invention claimed is:

1. A light-emitting system comprising:
a light-emitting device; and
a light-transmitting holding member holding the light-emitting device;

wherein the light-emitting device comprises:
a light-transmitting substrate;
a plurality of light-emitting units provided on a first surface of the substrate away from each other, each light-emitting unit comprising a light-transmitting first electrode, a light-reflective second electrode, and an organic layer located between the first electrode and the second electrode;
a light-transmitting region which is located between the light-emitting units, and through which light is transmitted in a thickness direction; and
an optical filter that overlaps the light-transmitting region and does not overlap the plurality of light-emitting units,
wherein the holding member comprises a first region overlapping the substrate and a second region located around the first region,
wherein the first region comprises a first portion overlapping the plurality of light-emitting units and having a first transmittance of visible light,
wherein the second region has a second transmittance of the visible light, and
wherein the first transmittance is higher than the second transmittance.

2. The light-emitting system according to claim 1, further comprising a light-transmitting insulating layer that defines the light-emitting unit,
wherein the light-transmitting region comprises:
a first light-transmitting region that overlaps the insulating layer and does not overlap the second electrode; and
a second light-transmitting region that overlaps neither the insulating layer nor the second electrode, and
wherein an edge of the optical filter overlaps the first light-transmitting region or the second light-transmitting region.

3. The light-emitting system according to claim 1,
wherein an edge of the second electrode extends to an outside of the light-emitting unit, and
wherein an edge of the optical filter overlaps a region of the second electrode which is located outside the light-emitting unit.

4. The light-emitting system according to claim 1, further comprising a light transmitting sheet member provided with the optical filter,
wherein the optical filter is provided in a region of the sheet member which overlaps at least a portion of the light-transmitting region and is not provided in a region of the sheet member which overlaps at least a potion of the light-emitting unit.

5. The light-emitting system according to claim 1, wherein the first region comprises a second portion not overlapping the plurality of light-emitting units and having the first transmittance.

6. The light-emitting system according to claim 1, wherein the first region comprises a second portion not overlapping the plurality of light-emitting units and having the second transmittance.

7. A light-emitting system comprising:
a light-emitting device; and
a light-transmitting holding member holding the light-emitting device;
wherein the light-emitting device comprises:
a light-transmitting substrate;
a plurality of light-emitting units provided on a first surface of the substrate away from each other, each light-emitting unit comprising a light-transmitting first electrode, a light-reflective second electrode, and an organic layer located between the first electrode and the second electrode;
a light-transmitting region which is located between the light-emitting units, and through which light is transmitted in a thickness direction; and
an optical filter that overlaps the light-transmitting region and overlaps a surface of the plurality of light-emitting units on an opposite side to a light emission surface,
wherein the holding member comprises a first region overlapping the substrate and a second region located around the first region,
wherein the first region comprises a first portion overlapping the plurality of light-emitting units and having a first transmittance of visible light,
wherein the second region has a second transmittance of the visible light, and
wherein the first transmittance is higher than the second transmittance.

8. The light-emitting system according to claim 7, further comprising a light-transmitting insulating layer that defines the light-emitting unit,
wherein the light-transmitting region comprises:
a first light-transmitting region that overlaps the insulating layer and does not overlap the second electrode; and
a second light-transmitting region that overlaps neither the insulating layer nor the second electrode, and
wherein an edge of the optical filter overlaps the first light-transmitting region or the second light-transmitting region.

9. The light-emitting system according to claim 7, wherein an edge of the second electrode extends to an outside of the light-emitting unit, and
wherein an edge of the optical filter overlaps a region of the second electrode which is located outside the light-emitting unit.

10. The light-emitting system according to claim 7, further comprising a light-transmitting sheet member provided with the optical filter,
wherein the optical filter is provided in a region of the sheet member which overlaps at least a portion of the light-transmitting region and is not provided in a region of the sheet member which overlaps at least a portion of the light-emitting unit.

11. The light-emitting system according to claim 7, wherein the first region comprises a second portion not overlapping the plurality of light-emitting units and having the first transmittance.

12. The light-emitting system according to claim 7, wherein the first region comprises a second portion not overlapping the plurality of light-emitting units and having the second transmittance.

* * * * *